United States Patent [19]

Miller

[11] 4,078,097
[45] Mar. 7, 1978

[54] METALLIC COATING PROCESS

[75] Inventor: Ronald Lee Miller, Grand Rapids, Mich.

[73] Assignee: International Prototypes, Inc., Wyoming, Mich.

[21] Appl. No.: 703,900

[22] Filed: Jul. 9, 1976

[51] Int. Cl.² .......................... B05D 1/08; B05D 3/10
[52] U.S. Cl. .................................. 427/34; 219/76.13; 239/83; 427/307; 427/402; 427/404
[58] Field of Search .................. 427/12, 34, 422, 423, 427/37, 49, 250, 251, 237, 307; 118/47, 49.1, 49.5, 302; 219/72, 76, 130; 239/81, 83, 84, 504

[56] References Cited

U.S. PATENT DOCUMENTS

| | | | |
|---|---|---|---|
| 1,133,508 | 3/1915 | Schoop | 219/76 X |
| 1,221,104 | 4/1917 | Stolle | 427/422 |
| 2,982,845 | 5/1961 | Lenni et al. | 219/76 |
| 3,016,447 | 1/1962 | Gage et al. | 427/34 |
| 3,358,114 | 12/1967 | Ingue | 219/76 |
| 3,947,607 | 3/1976 | Gazzard et al. | 219/76 X |
| 4,006,340 | 1/1977 | Gorinas | 427/34 X |

Primary Examiner—Morris Kaplan
Attorney, Agent, or Firm—McGarry & Waters

[57] ABSTRACT

An arc spray gun has a high pressure air nozzle. To the front of the air nozzle are two wire guides. A suitable metallic wire extends through each metallic guide. An electrical potential is placed through each wire within the nozzle wire guide. As the wire is heated by the electrical potential beyond its melting point, high pressure air is ejected from the air nozzle, atomizes the metal wire, and blows a metallic spray forward. A nozzle housing is within the path of the spray. The nozzle housing has two frusto-conical sleeves coaligned to direct the flow of the metal spray. An orifice plate is positioned in the path of the metal spray. The orifice plate has a plurality of fine apertures extending through another portion thereof, and in its center portion has a plurality of larger apertures extending therethrough. The atomized metallic spray passes through the two sleeves and the orifice plate. The spray is propelled by the high pressure air stream with a force sufficient to adhere the atomized metallic spray to a thermoplastic material. A solvent is previously applied to thermoplastic material to soften the outer surface of the thermoplastic material to allow the atomized metallic spray to be imbedded in the plastic.

6 Claims, 4 Drawing Figures

METALLIC COATING PROCESS

BACKGROUND OF THE INVENTION

1. Field of the Invention

The invention relates to atomized metal coating. In one of its aspects, the invention relates to a spray gun process to apply an atomized metallic coating to plastic parts evenly and without warpage.

2. Description of the Prior Art

Metallic spray guns have previously been used to spray a metallic coating onto metal parts. The metal coating was desired for various reasons. The metallic coating consisting of a more durable metal sprayed upon a part consisting of softer metal often increased the durability and life span of the coated metal part. A shiny metal coating was often placed upon a dull metal part to increase the aesthetic appearance of the metal part.

One spray gun which produced a metallic coating of good quality was a spray pistol manufactured by Ionarc Company under the trademark Arc Spray 200. The Arc Spray 200 uses maximum air pressure stream of 100 PSI and a wire feed rate of 24 pounds per hour for each 100 amps of current used to melt the wire at 220 volts.

In recent years a strong need for metallic coated plastic parts has arisen. Plastic parts are now used as a substitute for metal parts for a variety of uses.

Plastic parts are used in computers and electrical devices. Certain electrical devices are sensitive to radio frequencies, and such radio frequencies often interfere with the success of the electrical device. Plastic parts are unable to shield the electrical devices from radio frequency interference.

Plastic parts are also used in many devices which produce substantial amounts of heat. The plastic material, however, is not capable of conducting heat away from the certain hot spot.

To eliminate the above problems, plastic parts need a metallic coating. Plastic parts are now electroplated with silver. However, the electroplating process is expensive and time consuming.

Previous attempts to spray a metal coating onto plastic parts have been made but without success. The application of the metallic coating has so far been unsuccessful because the spray has given an uneven application to the plastic, the heat of metallic spray has caused warpage to the plastic part, or the application was not complete, leaving corners and crevices of the plastic parts exposed.

SUMMARY OF THE INVENTION

According to the invention, in a metallic coating process an apparatus for spraying atomized metal onto the surface of the plastic parts has a spray means and an operably connected refining means for spraying and refining to a fine mist a metallic spray which is applied onto a plastic substrate. The spray means has a means for producing a gas stream. Preferably the gas stream comprises air or other nonflammable gas. The air stream means can produce a minimum pressure of 120 PSI and preferably, is capable of producing a pressure up to 200 PSI.

The spray means has a means for feeding metal to an atomizing means for melting the metal. The air stream blows the atomized metal forward. Preferably the spray means includes a spray gun with an arc spray gun nozzle. The metals used in the arc spray gun are preferably metals or alloys that have a melting point less than 4,200° F. In one specific embodiment, zinc wire is fed to the melting means of the arc spray.

Preferably, the atomizing means includes an electric potential of 200 volts operably connected to the metal wire. A current, preferably from 50 to 300 amperes, passes through the metal wire.

In one specific embodiment, metal wire is supplied to the arc spray gun nozzle at a rate of from 15 pounds per hour up to 50 pounds per hour. Zinc wire preferably is supplied at a rate of 20–25 pounds per hour for every 100 amperes of current at 220 volts.

The metal or alloy is atomized and the air stream blows the atomized metal through a housing at a sufficient pressure to keep moisture within the housing at a minimum. The housing is preferably threaded onto a collar which is positioned around the gun nozzle. The housing is threaded onto the collar so that it may be rotatably adjusted on the collar. The housing preferably includes a converging frusto-conical shaped sleeve and a diverging frusto-conical shaped sleeve. The converging sleeve is secured at its larger end to the inner surface of the housing. The metal spray is directed through the converging sleeve. After the spray leaves the narrow end of the frusto-conical shaped sleeve the spray enters the diverging frusto-conical shaped sleeve and is blown therethrough.

At the outer larger end of the diverging sleeve is an orifice plate. The plate has a plurality of apertures therethrough through which the spray egresses. Preferably, the orifice plate is circular and has a plurality of small apertures around its periphery. A plurality of larger apertures extend through the center portion of the orifice plate. The plurality of apertures preferably have their central axis perpendicular to the plane defined by the orifice plate.

Preferably the diverging sleeve is adjustable along the direction of the metal spray. It is also desirable that the diverging sleeve has flexibility so that its conical sides contract or expand at the orifice plate. The flexible diverging sleeve can be made from a thermoplastic, thermo-set plastic or a thin sheet of alloy. In one specific embodiment, the flexible diverging sleeve is threadably mounted onto the converging sleeve so that when the housing is rotated in the collar, the diverging sleeve is threaded about the converging cone, expanding or contracting the opening of its smaller end. The outer larger end of the diverging sleeve is also inversely adjusted to a desired diameter. As the small end contracts, the large end becomes larger and vice versa. The diameter of the outer larger end controls the diameter of the metallic spray which passes through the orifice plate.

In one specific embodiment, a shroud is attached to the housing and extends beyond the orifice plate so that errant spray passing through the orifice plate is eliminated. The shroud also acts as a protective shield against accidental burns. Preferably the shroud and housing extend a sufficient length so that the metal spray has a temperature that would permit an operator to be safe from severe burns as the spray egresses from the shroud.

According to the invention, a method for coating a plastic substrate with an atomized metal has the metal atomized in an electric discharge zone. The metal is continuously supplied to the electric discharge zone. After the metal is atomized, a high pressure gas stream having a minimum gauge pressure of 120 pounds per square inch is applied to the atomized metal to form a high pressure atomized spray. The metal spray is shaped into a beam of contracted breadth and directed away from the electric discharge zone. The metal spray is refined into a fine mist while still being under the influence of the high pressure gas stream. The mist is directed against a plastic substrate to which it is adhered to form a metallic coating. It is preferable that the metallic spray is gradually contracted through an open ended funnel as it is directed away from the electric discharge zone.

It is also preferably that the breadth of the spray is controlled prior to the refining of the spray to a mist.

It is preferred that the spray passes through an orifice plate having a plurality of fine apertures therethrough so that the spray is refined into a fine mist.

It is preferable that before the spray is applied, a solvent is sprayed onto the plastic part. The solvent reacts with the surface of the plastic part to soften and roughen the outer surface of the plastic. The solvent promotes the adherance of the metal coating onto the plastic and promotes the metal spray to imbed itself slightly into the plastic surface. The solvent used preferably is methyl ethyl ketone or acetone.

To prevent any flaking of the metallic coating, a conventional outer coating, such as lacquer or a transparent plastic, is preferably applied over the metallic coating.

An advantage of the invention is that it allows a thin coat of metal, preferably ranging from 0.001 to 0.005 inches, to be sprayed onto a plastic part, eliminating the time and expense which is needed in electroplating processes. The thin metal coat can be applied to the plastic part without warping the plastic part under proper application techniques. The metallic coating is imbedded in the outer surface of the plastic part to provide for permanent adherance between the metal and plastic.

BRIEF DESCRIPTION OF THE DRAWINGS

The invention will now be described with reference to the accompanying drawings in which.

DETAILED DESCRIPTION OF THE PREFERRED EMBODIMENT

Figure 1:
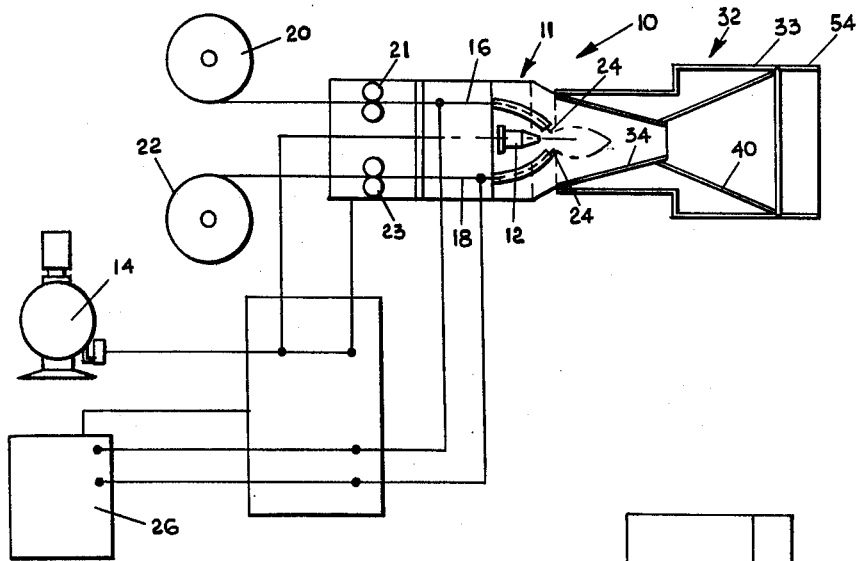
FIG. 1 is a side elevational view schematically illustrating a spraying apparatus according to the invention.

Referring to FIG. 1, a spray gun 10 has a gun nozzle 11 which includes an air stream nozzle 12 operably connected to a high pressure air compressor 14.

Metal wires 16 and 18 lead off of two insulated rollers 20 and 22 and converge at a point in front of the air stream nozzle 12 in the path of the high pressure air stream. The metal wires 16 and 18 have a melting point less than 4,200° F. The converging ends 24 of the metal wires 16 and 18 are coupled to an electric voltage differential 26. The electric voltage differential is sufficient to atomize the two metal wires 16 and 18 at their converging ends 24. A voltage of 220 volts is a sufficient differential to atomize the wires.

Figure 2:
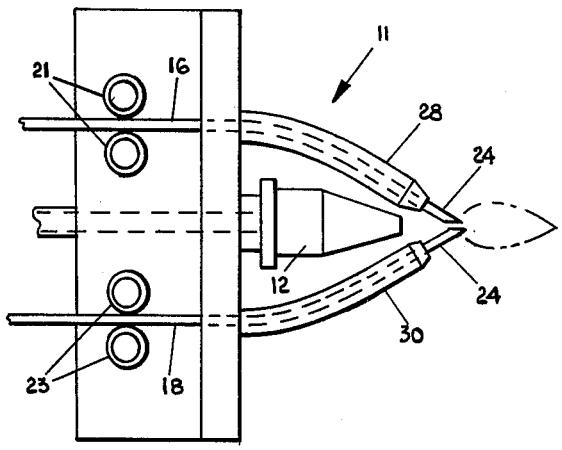
FIG. 2 is an enlarged fragmentary view of the atomizer illustrated in FIG. 1.

Referring to FIG. 2, the metal wires pass through two tubular guides 28 and 30 so that the converging ends 24 are fixed in front of the air stream nozzle 12 and within the path of the high pressure air stream as the metal wires 16 and 18 are being fed by the two feeders 21 and 23.

Figure 3:
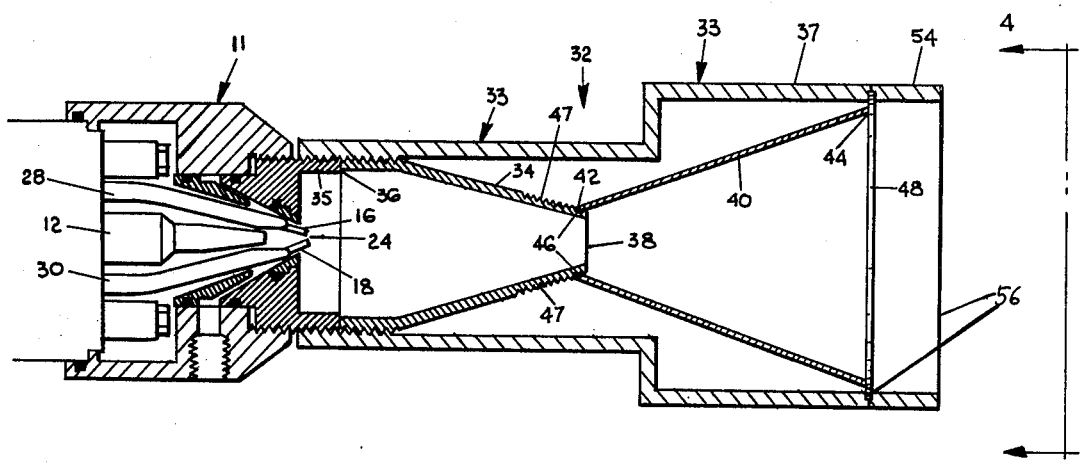
FIG. 3 is a side elevational view in section of the housing illustrated in FIG. 1.

Referring to FIG. 3, placed over the gun nozzle 11 is a housing 32. The housing 32 comprises a shell 33, a shroud 54, an orifice plate 48, a converging frusto-conical shaped sleeve 34, and a diverging frusto-conical shaped sleeve 40 placed within the shell 33. The shell 33 has a wider diameter at the far end 37. The shell 33 is threaded onto a collar 35 which secures the housing 32 over the gun nozzle 11. The shell 33 is secured to the collar 35 so as to be rotatably mounted onto the said collar 35. The converging sleeve 34 has large end 36 placed near the converging ends 24 of the two metal wires 16 and 18. The large end 36 is secured to the shell 33 at the collar so that the sleeve 34 is fixed relative to the shell 33. The small open end 38 of the converging sleeve 34 is placed within a small open end 42 of the diverging frusto-conical shaped sleeve 40. The small end 42 threadably engages, at point 46, threaded sides 47 of the converging sleeve 34 so as to allow the two sleeves to rotate relative to each other along their central axis.

The diverging sleeve 40 is made from flexible material such as a flexible thermoplastic with a high melting point or a thin sheet of metal alloy. As the diverging sleeve 40 rotates about the threaded side 47 toward the nozzle 12, the diverging sleeve 40 flexes so that the small end 42 becomes larger in size while the large outer end 44 decreases in size.

The angle of divergence of sleeve 40 is approximately ten degrees larger than the angle of covergence of sleeve 34.

Figure 4:
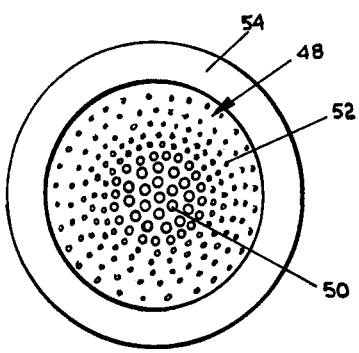
FIG. 4 is a front elevational view of the spray nozzle taken along the lines 4—4 of FIG. 3.

The outer end 44 of the diverging sleeve 40 is placed adjacent to an orifice plate 48. The orifice plate 48 fits at the end of the shell 33 and beginning of shroud 54. As shown in FIG. 4, the orifice plate 48 has a plurality of large central apertures 50 around its center portion and a plurality of smaller sized apertures 52 placed around the orifice plate periphery. The central axis of the apertures are perpendicular to the plane defined by the plate 48.

Referring back to FIG. 3, an open ended shroud 54 is connected to the shell 33 so that the open ends 56 of the shroud are aligned with the axis of the sleeves 34 and 40 and the path of the high pressure air stream.

In operation, the high pressure air stream blown through air stream nozzle 12 has a minimum gauge pressure of 120 PSI. The converging ends 24 of wires 16 and 18 are placed within the path of the high pressure air stream. The electric voltage differential 26 connected to wires 16 and 18 is 220 volts with a current of 100 amperes. The electric differential 26 atomizes the two metal wires at their converging ends 24 so that the air pressure stream applied to the metal creates a metal spray which is directed through the converging sleeve 34. The converging sleeve 34 focuses the spray so that it enters the diverging sleeve 40 with a substantial velocity. The threadably fastened diverging sleeve 40 has its large end adjusted to a desired size to control the diameter of the spray which is blown through the orifice plate 48. The spray is then blown through the larger and smaller apertures 50 and 52 of the orifice plate 48 to become a fine mist.

The shroud 54 eliminates any errant mist which is not substantially coaxial with the alignment of the air stream nozzle 12 the sleeves 34 and 40.

The metal wires 16 and 18 must be fed by the rollers 21 and 23 at a rate slow enough to allow the electric voltage differential 26 to act upon the metal wires 16 and 18 so as to atomize the wires 16 and 18 at the converging ends 24. Zinc wire can be fed at a rate of 15 pounds per hour when the electric current through the wires is set at 220 volts and 100 amperes. The high pressure air stream must have sufficient pressure to atomize the metal to a fine mist and blow the atomized metal outwardly through the conical sleeves, to keep moisture within the housing to a minimum and to imbed the metallic spray into the plastic part. A gauge pressure of 120 PSI in the air stream is adequate.

The converging sleeve 34 directs the spray and maintains the pressure of the air stream at a sufficient pressure so that the spray that passes through the apertures of the orifice plate has a sufficient pressure to become imbedded in the outer surface of the plastic (not shown) and adhere to the plastic to create a thin metallic coating.

A solvent such as methyl ethyl ketone and acetone is sprayed onto the plastic part prior to the metallic spray. The solvent slightly roughens the outer surface of the plastic and creates a softer outer surface in which the atomized metal spray can be imbedded.

Excessive heat from the melted metal is controlled by the cooling effect of the air stream and the length of the housing 32 so that when the spray leaves the shroud 54, the metal spray is cooled sufficiently so that the metal spray will not warp the plastic on which it is sprayed and also will not severely burn skin which may accidently make contact with the spray.

In this fashion, a metallic coating can be applied to the plastic part without the part warping or having over a one-half percent flaking of metallic particles. A thin coat of a thickness of 0.001 to 0.01 inches can be applied to a plastic part in a quick and easy manner. The adherance of the metallic coating onto the plastic is of a permanent nature.

To further reduce the percentage of flaking, an outer coating of lacquer can be sprayed over the metallic coating.

It should be understood that the foregoing embodiment of the invention is merely illustrative of the preferred practice of the invention and that various changes and modifications may be made in the arrangements and details of the embodiment described herein without departing from the spirit and scope of the invention.

The embodiments of the invention in which an exclusive property or privilege is claimed are defined as follows:

1. A method for coating a plastic substrate with an atomized metal, the method comprising: continuously atomizing a metal in an electric discharge zone; continuously supplying metal to the electric discharge zone; continuously applying a gas pressure in excess of a gauge pressure of 120 pounds per square inch to the atomized metal to form a high pressure atomized metal spray; shaping the spray into a beam of contracted breadth; directing the spray away from the electric discharge zone through the area of contracted breadth and subsequently passing the spray through an enlarged area plate having have a plurality of fine apertures therethrough to effect breaking the spray into a high pressure shaped mist of such atomized particles; and directing the high pressure shaped mist against the plastic substrate, the plastic being a sufficient distance from the electric discharge zone to allow the mist to adequately cool so as not to warp the plastic substrate from excessive heat.

2. A method as defined in claim 1 wherein a zinc wire having a melting temperature less than 4,200° F. is fed to the electric discharge zone at a rate of 20–25 pounds per hour; before application of the metal spray a fine solvent spray is applied to the plastic substrate so that the fine coating of solvent softens and roughens the outer surface of the plastic substrate so that the pressurized metal spray can be imbedded in the softened outer surface of the plastic substrate; the zinc coating is greater than 0.001 inches and less than 0.005 inches.

3. A method as defined in claim 1 wherein the metal has a melting point less than 4,200° F. and is supplied at a rate of at least 15 pounds per hour and less than 50 pounds per hour.

4. A method as defined in claim 1 wherein a fine solvent spray is applied to the plastic part before the metal is applied so that the fine coating of solvent softens and roughens the outer surface of the plastic part so that the pressurized metal spray can be imbedded in the softened outer surface of the plastic part.

5. A method as defined in claim 1 wherein the applied coating is greater than 0.001 inches and less than 0.01 inches.

6. A method as defined in claim 1 wherein a thin overcoat is applied over the metallic coating to prevent any flaking of metal.

* * * * *